United States Patent [19]
Brown

[11] Patent Number: 5,121,085
[45] Date of Patent: Jun. 9, 1992

[54] DUAL-CHARGE-PUMP BANDWIDTH-SWITCHED PHASE-LOCKED LOOP

[75] Inventor: Russell W. Brown, Nepean, Canada

[73] Assignee: Digital Equipment Corporation, Maynard, Mass.

[21] Appl. No.: 722,752

[22] Filed: Jun. 28, 1991

[51] Int. Cl.[5] ............................................. H03L 7/093
[52] U.S. Cl. ......................................... 331/8; 331/10; 331/17; 331/25; 360/37.1; 360/51
[58] Field of Search ........................ 331/8, 10, 17, 25; 360/37.1, 51; 358/319

[56] References Cited

U.S. PATENT DOCUMENTS

| | | | |
|---|---|---|---|
| 4,694,326 | 9/1987 | Demmer | 358/19 |
| 4,942,370 | 7/1990 | Shigemori | 331/17 X |

OTHER PUBLICATIONS

Gardner, F. M., "Charge-Pump Phase-Lock Loops", IEEE Trans. on Communications, vol. COM-28, No. 11, Nov. 1980, pp. 1849-1858.

*Primary Examiner*—Siegfried H. Grimm
*Attorney, Agent, or Firm*—Cesari & McKenna

[57] ABSTRACT

Separate charge pumps (58, 60 and 74, 76) drive integral and proportional control paths for a voltage-controlled oscillator (52) in a phase-locked loop (50). A control circuit (74) varies the loop gain of the phase-locked loop by varying the current supplied by the integral-path charge pump (58,60) through a range that is the square of the range through which the current supplied by the proportional-path charge pump (74, 76) is varied. As a consequence, the damping factor of the loop response changes very little as the loop gain is varied through a large range.

22 Claims, 4 Drawing Sheets

DUAL-CHARGE-PUMP BANDWIDTH-SWITCHED PHASE-LOCKED LOOP

The present invention is directed to variable-bandwidth phase-locked loops. It finds particular, although not exclusive, use in disk drives.

FIG. 1 is a simplified diagram of a disk drive in which a conventional phase-locked loop is employed to derive clock information. A magnetic read head 12 detects magnetization transitions on the surface of a disk 14, and signal-processing circuitry 16 processes the resultant output to generate a signal whose form is that needed for data extraction.

Data on disk 14 are encoded in the distances between magnetic transitions on the disk. These transitions can be thought of as being permitted to occur only at predetermined positions within regularly spaced bit frames; a transition does not necessarily occur in every bit frame, but if it does, it occurs at a predetermined location within the frame.

As the bit frames pass under the head 12, they define corresponding bit times, and the signal-processing circuitry 16 processes the resultant signals from the head 12 into pulses, from which a data-extraction circuit 18 extracts the data by sampling the resultant signal in each bit time at a point therein known to be the most reliable for that purpose. A clock signal on line 20 triggers the data-extraction circuit 18 at these times, and it is the function of a phase-locked loop 22 to generate the clock signal in synchronization with the passage of the bit frames beneath the read head 12.

The phase-locked loop 22 employs a phase comparator 26 to compare the times of transitions in the clock signal on line 20 with those in the signal-processing-circuit output on line 24. The comparison results are used to control the frequency of the voltage-controlled oscillator 28 that produces the clock signal. Specifically, upon every occurrence of a pulse on line 24, the phase comparator 26 may produce a fixed-duration output pulse on line 30 and an output pulse on line 32 whose duration corresponds to the overlap between the pulses on lines 20 and 24. These pulses turn on and off respective current sources 34 and 36, which respectively draw current from and drive current into a proportional-plus-integral feed-forward RC network comprising a resistor R and capacitor C. On an average basis, the net current flowing through the RC network is an indication of the phase relationship between the outputs of the voltage-controlled oscillator 28 and the signal-processing circuitry 16.

The phase comparator is designed to provide an average net current of zero when the phase relationship has the value that causes triggering of the data-extraction circuitry 18 at the most-reliable point in the bit time, and the presence of the capacitor C tends to cause the phase-locked loop 22 to drive this net current to zero and thus achieve the proper phase relationship. Specifically, if the path from the phase comparator 26 to the voltage-controlled oscillator 28 were strictly proportional—i.e., if the capacitor C were absent and the current sources 34 and 36 only drove resistor R—there would be a static phase error at steady state because the average VCO control voltage required to maintain the proper frequency is not in general the value that would result from a net average current of zero in a strictly proportional network. The capacitor C integrates this error, however, and accordingly drives the static error to zero.

In most disk drives, the phase-locked loop operates with different loop bandwidths over different parts of a disk track. Each of the concentric tracks on the disk 14 is circumferentially divided into data-containing sectors by headers, which contain various housekeeping information, such as the track and sector number. One of the header fields contains a clock signal. The clock signal contains pulses that occur with a regular period, to which the phase-locked loop 22 synchronizes itself. Since the phase-locked loop 22 may have a fairly significant frequency error at the beginning of the synchronization interval, its control loop must have a high bandwidth in order t respond to the resultant rapidly changing phase error. But the frequency should be essentially correct when the head is over such regions, because it has been synchronized during the clock interval. The loop should therefore need to make only relatively minor phase adjustments when it encounters pulses in these information-containing regions, in which the pulses do not occur on as regular a basis. In this latter state, called the "tracking" state, it is desirable for the loop bandwidth to be narrower than it is in the acquisition state so that the loop is relatively immune to noise and can thus maintain a steady clock frequency.

There are a number of ways to switch between the wider and narrower bandwidths, but the most-convenient way is to adjust the loop gain by changing the currents that the current sources 34 and 36 provide. To understand the resultant effect, consider the phase-locked-loop output to be the output phase $\phi_0$ of the voltage-controlled oscillator, and its input to be the phase $\phi_i$ of the signal-processing-circuit output. Current sources 34 and 36, are often referred to together as a "charge pump." For a given current setting, the output of the charge pump 34, 36 takes the form of pulses of fixed magnitude but of durations that vary with the sensed phase difference. This clearly is distinctly non-linear behavior. However, if one ignores features of the phase-locked loop's response that are short in duration—on the order of only a few bit times—then the response of the loop can be evaluated to an acceptable approximation by treating the charge-pump output as though it were an analog value proportional to the phase difference.

The phase comparator 26 thus effectively subtracts $\phi_o$ from $\phi_i$ and causes a net average charge-pump output current o that is proportional to the phase difference in accordance with a proportionality $K_\phi$:

$$i = K_\phi(\phi_i - \phi_o) \tag{1}$$

In the complex-frequency domain, therefore, the control voltage applied to the voltage-controlled oscillator can be written as:

$$V_{vco} = K_\phi(\phi_i - \phi_o)(R + 1/Cs) \tag{2}$$

If the relationship between the VCO frequency f and VCO input voltage $V_{vco}$ is given by $f = f_0 + V_{vco} K_v / 2\pi$, then $$\phi_o = (\phi_i - \phi_o)(R + 1/Cs)(K_\phi K_v/s) + 2\pi f_0/s^2 + \phi_o(0)/s \tag{3}$$

because the VCO output phase $\phi_o$ is the integral of the VCO frequency. Therefore, if we ignore the inputindependent part of the response, we obtain the following transfer function:

$$\frac{\Phi_o}{\Phi_i} = \frac{K_\phi K_V R(s + 1/RC)}{s^2 + K_\phi K_V Rs + K_\phi K_V/C}. \quad (4)$$

Since the numerator is linear in s and the denominator is of the form:

$$s^2 + 2zw_n s + w_n^2, \quad (5)$$

we recognize that, for $z<1$, the impulse response of the system is of the form:

$$A \exp(-zw_n t)\cos(wt+\theta)( \quad 6)$$

where $\theta$ is a constant and $$w = w_n(1-z^2)^{\frac{1}{2}}. \quad (7)$$

Inspection of equation (6) reveals that the rate at which the transient response decays is proportional to the product of the damping factor z and the natural frequency $w_n$. A comparison of equations (4) and (5) indicates that this decay factor is proportional to $K_\phi$, i.e., to the gain, in amperes per radian, associated with the phase detector and charge pump. It is therefore possible to change the bandwidth by merely changing the current that the charge pump produces when it is turned on.

The prior-art phase-locked loop 22 of FIG. 1 therefore includes control circuitry 40 for controlling the charge-pump current level. During the header's timing burst, the control circuit 40 causes the charge-pump level to be high and thereby enables the phase-locked loop 22 to respond rapidly. At other times, it sets the charge-pump current to a lower level, and the loop therefore responds more slowly.

Varying the charge-pump current is an advantageous bandwidth-change mechanism because it lends itself to adjustment without introducing offsets. It also makes it easy to make the bandwidth reduction gradual. This latter feature is desirable because it avoids the error perpetuation that can result when noise reaches a phase-locked loop just before it makes a discontinuous bandwidth reduction.

However, conventional charge-pump approaches have limitations that can limit improvements in disk-drive performance. As drive densities and speeds increase, header overhead increases undesirably if the speeds with which phase-locked loops reach synchronism do not also increase without compromising the loop's ability to maintain a steady clock rate in the tracking mode. But such synchronization-speed increases are difficult to achieve with conventional charge-pump configurations. The root of this difficulty lies in the fact that, if all other parameters remain equal, increasing the loop gain increases not only the rate of decay $zw_n$ but also the damping factor z, which is a rough measure of the relationship between the decay time constant and the period of the ringing frequency w: when z is small fraction of unity, the output signal responds to an error step by overshooting the target phase significantly and ringing with a magnitude that is significant for many ring cycles. A low damping factor is clearly undesirable in a system in which the output of the phase-locked loop is to trigger a data-extraction circuit at a precise point in each bit interval. For tracking purposes, therefore, the damping factor should be a large fraction of unity; many designers consider a damping factor of $(\frac{1}{2})^{\frac{1}{2}}$ to be optimum.

If the damping factor has such a high value in the tracking mode, the increased loop gain required for rapid synchronization will make it even higher in the acquisition mode. Such a result might at first seem desirable; increases in the damping factor beyond $(\frac{1}{2})^{\frac{1}{2}}$ increase the decay rate, at least initially. However, they increase the ringing period even more, and the result can be an increase in the time required to reach the target phase angle the first time despite a decrease in overall transient duration. Moreover, after the damping factor z exceeds unity, the impulse response is no longer of the form given by equation (6). Instead, it becomes the sum of two exponentials, one of which represents a decay that actually slows as the loop gain increases. At that point, further increases in loop gain are counterproductive.

To enable further loop-gain changes to increase the acquisition bandwidth, therefore, the values of other circuit parameters must be changed to reduce the damping factor for a given loop gain. Unfortunately, such changes increase tracking-mode ringing.

SUMMARY OF THE INVENTION

We have invented a way of making large bandwidth changes by varying loop gain without suffering excessive tracking-mode ringing. We do this by employing two independently variable gain elements, such as two charge pumps, one of which has a greater effect on the proportional component of the VCO control signal and the other of which has a greater effect on the integral component. This enables us to increase bandwidth without increasing the damping factor to the extent that prior-art arrangements do.

Specifically we vary the proportional-component gain through a dynamic range that differs from, and is preferably less than, the dynamic range through which we vary the integral-component gain. If the proportional-component gain varies through a range that is only the square root of that of the integral-component gain, for example, the damping factor remains constant throughout the bandwidth range.

BRIEF DESCRIPTION OF THE DRAWINGS

These and further features and advantages of the present invention are described below in connection with the accompanying drawings, in which.

DETAILED DESCRIPTION OF ILLUSTRATIVE EMBODIMENTS

Figure 1:
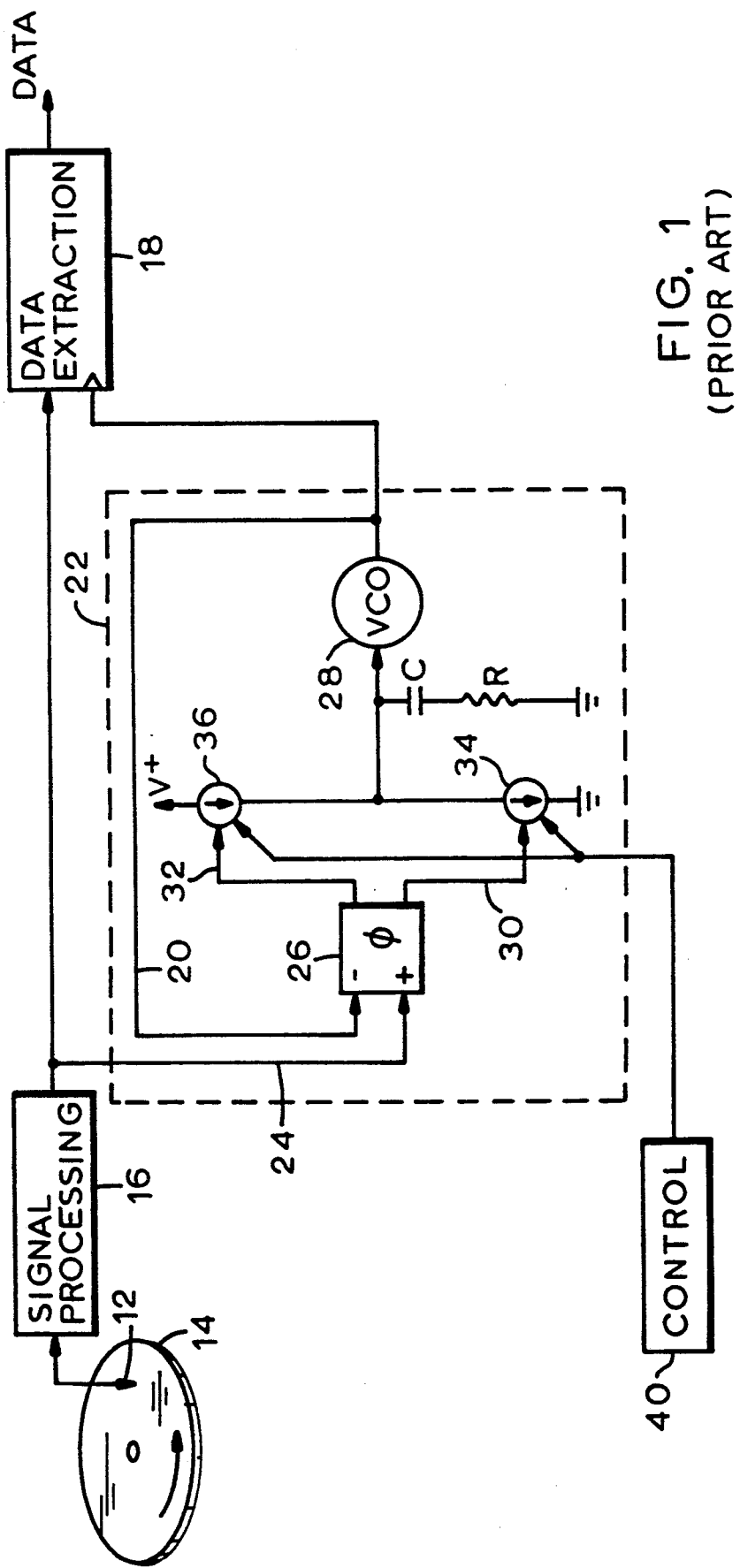
FIG. 1 is a block diagram of a prior-art phase-locked loop being used for clock-signal extraction in a disk drive.
Figure 2:
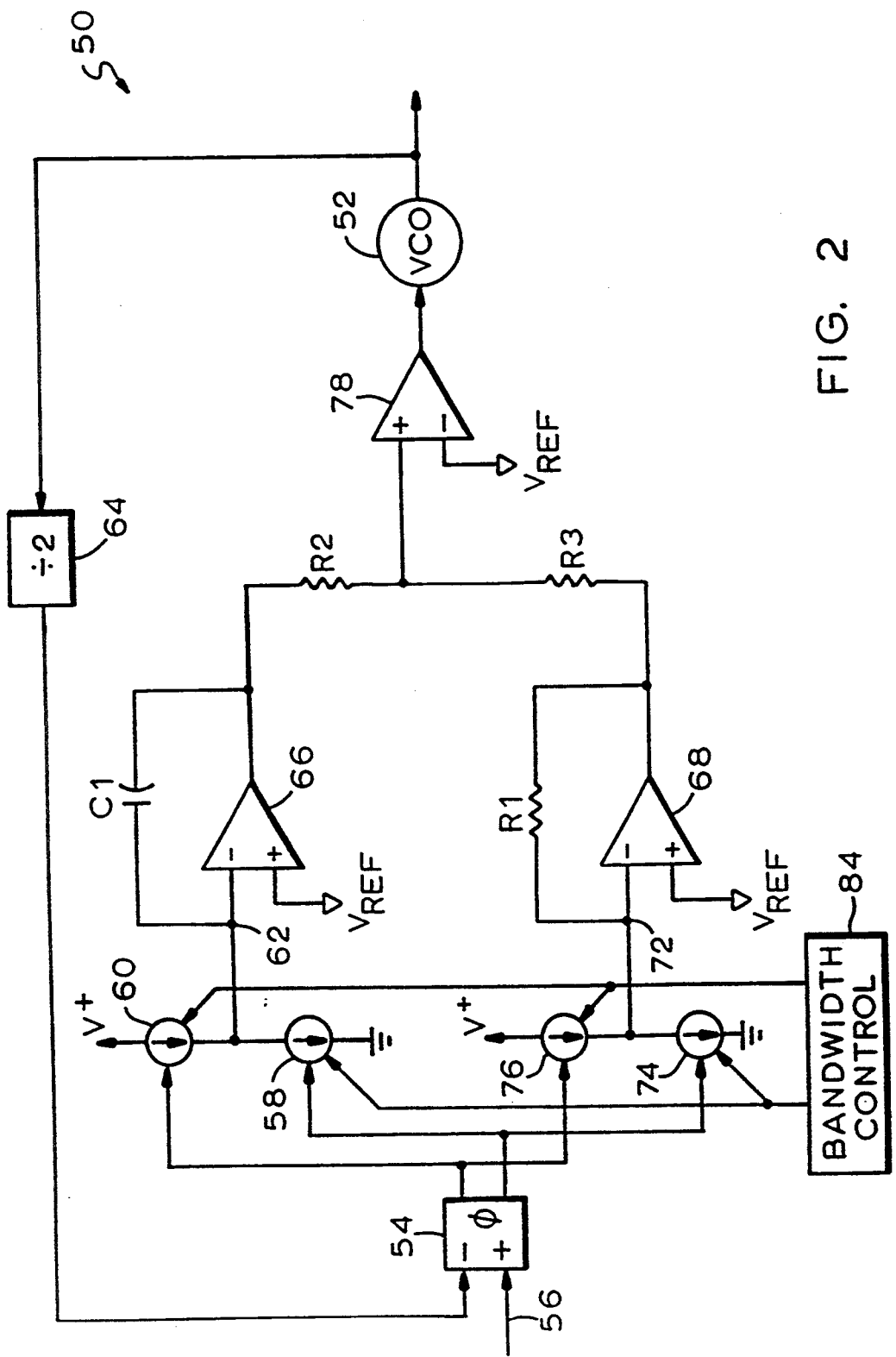
FIG. 2 is a similar block diagram of a phase-locked loop that embodies the present invention.

Like the phase-locked loop of FIG. 1, a phase-locked loop 50 of FIG. 2 includes a voltage-controlled oscillator 52 whose output is fed to a phase comparator 54. Comparator 54 compares the phase of the output with the phase of a signal on line 56, which is derived from the output of a disk-drive read head. Like the output of the phase comparator 26 of FIG. 1, that of the phase comparator 54 of FIG. 2 is ultimately used to set the control voltage for its associated voltage-controlled oscillator 52.

However, resistor R1 and capacitor C1 of FIG. 2 differ from resistor R and capacitor C of FIG. 1 in that they occupy separate paths between the phase comparator 54 and the voltage-controlled oscillator 52. Specifically, a first charge pump comprising current sources 58 and 60 operates in the manner described above in connection with charge pumps 34 and 36 to drive into junction 62 a net current whose average value bears a linear relationship to the phase difference between the input on line 56 and the output of the voltage-controlled oscillator 52. (In the illustrated embodiment, the actual oscillator is controlled to generate a frequency twice that of the input, so a voltage divider 64 divides the output in frequency by two and applies the resultant signal to the phase comparator 54.)

Operating in the usual negative-feedback manner, an amplifier 66 drives its inverting input to a reference level $V_{REF}$ by drawing through capacitor C1 a current equal to that driven into junction 62 by charge pump 58, 60. The voltage across capacitor C1 is thus proportional to the integral of the current supplied by that charge pump. A similar amplifier 68 similarly drives its inverting input to $V_{REF}$ by drawing through resistor R1 the current driven into junction 72 by a second charge pump comprising current sources 74 and 76. The voltage output of amplifier 68 is therefore proportional to that charge-pump current, and its average value is thus linearly related to the phase difference detected by the phase comparator 54.

The mean of these two amplifier outputs—i.e., a value proportional to their sum—appears at the junction of summing resistors R2 and R3 and serves as the input to a buffer amplifier 78, which applies to the VCO 52 an output proportional to the difference between $V_{REF}$ and this sum voltage. The VCO control voltage is thus proportional to the sum of the phase difference and its integral. (Although resistors R2 and R3 are equal in the illustrated embodiment, there is no reason why they could not be different so as to produce a weighted sum.)

Through an analysis similar to that performed in connection with the circuitry of FIG. 1, therefore, it can be shown that the transfer function of the phase-locked loop of FIG. 2 is as follows:

$$\frac{\Phi_o}{\Phi_i} = \frac{K_2 K_v Rs + K_1 K_v/C}{s^2 + K_2 K_v Rs + K_1 K_v/C}, \quad (8)$$

where $K_1$ is the ratio of the average output of charge pump 58, 60 to the phase error that causes it, $K_2$ is the corresponding parameter for charge pump 74, 76, and $K_v/2\pi$ is the change in VCO frequency per unit change in the output voltage of amplifier 66 or 68.

It will be recalled that the rate of decay of the impulse response given by expression (6) is $zw_n$. Comparing expression (5) with the denominator of the transfer function set forth in equation (8) reveals that this factor for the phase-locked loop of FIG. 2 is given by the following expression:

$$zw_n = K_v K_2 R/2 \quad (9)$$

That is, the rate of decay, and thus the bandwidth is proportional to $K_2$, so it is possible to control the bandwidth by changing the current level of charge pump 74, 76.

It can also be seen that the damping factor is given by the following expression:

$$z = (\tfrac{1}{2})(K_2 R)(K_v C/K_1)^{\tfrac{1}{2}} \quad (10)$$

This equation shows that the damping factor is proportional to $K_2$ and inversely proportional to $(K_1)^{\tfrac{1}{2}}$. Accordingly, if $K_2$ is kept proportional to $K_2^2$ while $K_2$ is varied to change the loop bandwidth, the damping factor will remain constant except for data-dependency effects, and a nearly optimum damping factor can be achieved both in the acquisition mode and in the tracking mode. The phase-locked loop 50 of FIG. 2 is arranged to maintain this relationship, as will now be explained in connection with FIGS. 3A and 3B.

Figure 3A:
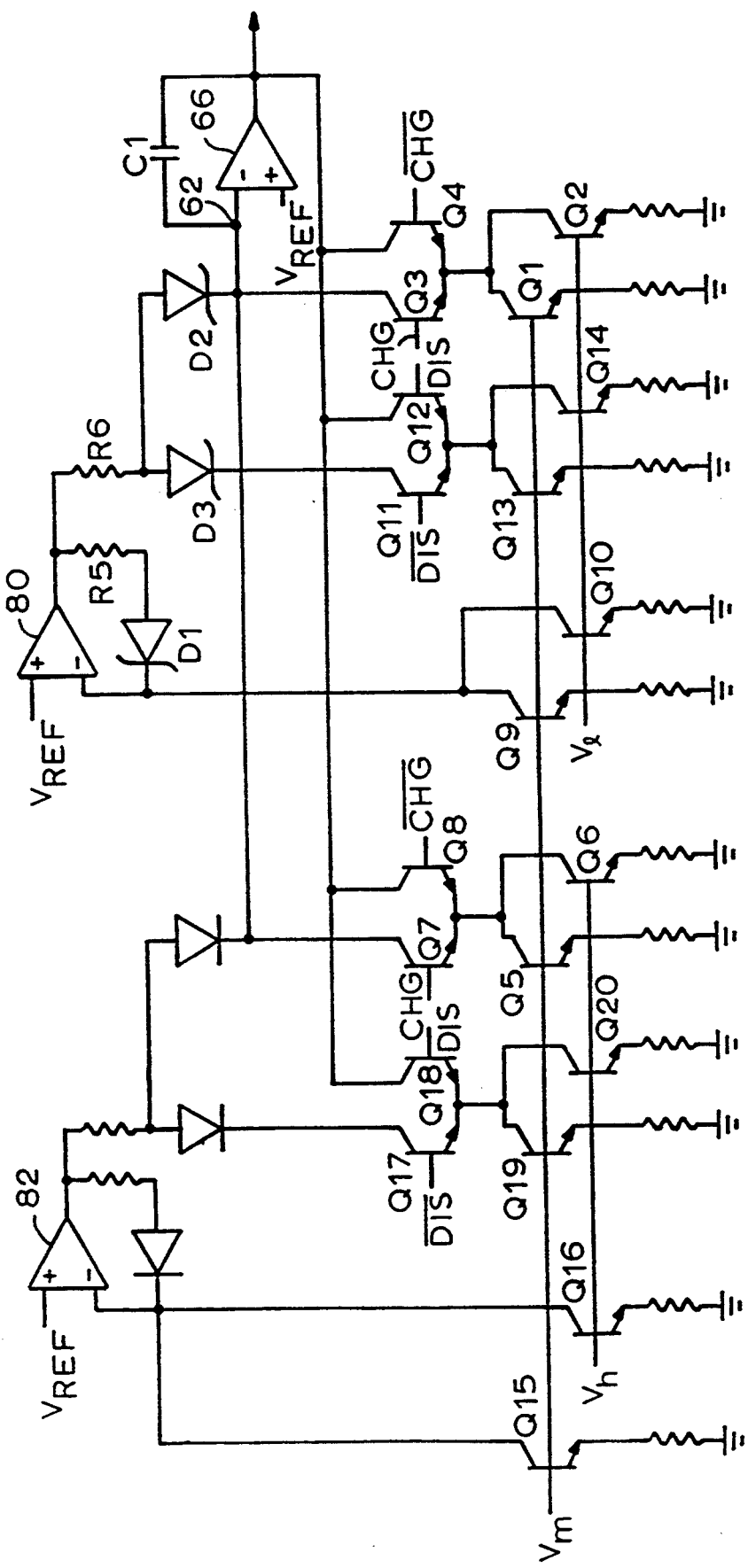
FIGS. 3A and 3B depict the charge-pump circuitry of the FIG. 2 phase-locked loop in greater detail.

Switched current source 58 of FIG. 2 is embodied in the parallel combination of two switched component current sources in FIG. 3A. One source includes transistors Q1 and Q2, which draw medium and low currents $I_m$ and $I_l$, respectively, under the control of corresponding control voltages $V_m$ and $V_l$ to produce a current $I_m + I_l$, which is switched by a current switch comprising transistors Q3 and Q4. The other component source in composite current source 58 includes transistors Q5 and Q6, which draw medium and high currents $I_m$ and $I_h$ in response to control voltages $V_m$ and $V_h$, respectively. Transistors Q7 and Q8 switch this current $I_m + I_h$.

A charging signal CHG turns on switching resistor Q3, and the complementary signal $\overline{CHG}$ turns off switching transistor Q4 so as to cause all of the current drawn by Q1 and Q2 to come from junction 62, as was explained previously in connection with FIG. 2. When CHG is low, on the other hand, $\overline{CHG}$ is high, and Q4 accordingly causes the Q1 and Q2 currents to be drawn from the output port of amplifier 66 without affecting its output voltage.

Inspection of the switched current source comprising transistors Q5, Q6, Q7, and Q8 reveals that it operates in the same manner so that, when a CHG pulse is present, the two switched sources that make up composite source 60 together draw a current $I_h + 2I_m + I_l$ from junction 62 and thus cause amplifier 66 to drive that current through capacitor C1, as was described above in connection with FIG. 2.

Like source 58, source 60 comprises two parallel sources, one of which drives a current $I_m + I_l$ and the other of which drives a current $I_m + I_h$. However, in order to take advantage of the speed of the available npn transistors to drive current in the other direction, each component source in composite source 60 is somewhat more complicated than the corresponding components of source 58. One of the two component sources of source 60 includes a current source that comprises a combination of differential amplifier 80 and transistors Q9 and Q10, a current switch that comprises transistors Q11 and Q12, and a current sink that comprises transistors Q13 and Q14. Source 60's other parallel source is a similar combination of an amplifier 82 and transistors Q15, Q16, Q17, Q18, Q19, and Q20.

Transistors Q9 and Q10 draw a total current $I_m + I_l$ from the junction at the inverting input terminal of amplifier 80, which drives that terminal to the reference level $V_{REF}$ by causing the current $I_m + I_l$ to flow through the series combination of resistor R5 and a Schottky diode D1. While phase detector 54 generates a DIS pulse, the $\overline{DIS}$ signal keeps transistor Q11 turned off, and the resultant output voltage of amplifier 80 causes current to flow to the junction 62 at the inverting input terminal of amplifier 66 through another Schottky diode D2 and a resistor R6, which is equal in value to resistor R5. Since resistors R5 and R6 are equal in value and are both in series with respective Schottky diodes D1 and D2, and since amplifiers 66 and 80 have the same reference voltage applied to their non-inverting input ports, the current that flows from amplifier 80 to junction 62 is equal to $I_m + I_l$. At the same time, transistor Q12 is turned on and draws current $I_m + I_1$ from the output port of amplifier 66 without having any significant effect on its output voltage.

When no DIS pulse is present, on the other hand, transistor Q11 draws the R6 current through another Schottky diode D3, back-biasing diode D2 so that no current flows into junction 6 from amplifier 80.

Inspection of the source comprising amplifier 82 and transistors Q15 through Q20 reveals that they operate in a similar manner in response to a DIS pulse. Consequently, the presence of a DIS pulse causes a current whose value is $I_h + 2I_m + I_l$ to flow into junction 62, while a CHG pulse causes a current having the same value to be drawn from that junction.

Analog control signals $V_h$, $V_m$, and $V_l$ control the values of these currents. Specifically, the value of $I_l$ is a constant 80 μA, while, at the beginning of the acquisition state, the values of $I_m$ and $I_h$ are 720 μA and 6.48 mA, respectively. At the beginning of the acquisition state, therefore, a charge pulse or a discharge pulse from the phase comparator 54 causes 8.0 mA to be driven into or drawn from junction 62 and thus to flow in one or the other direction through filter capacitor C1.

Sometime during the acquisition phase, the control circuit 84 (FIG. 2) that generates the control voltages $V_h$, $V_m$, and $V_l$ begins to reduce the value of $V_h$ in a gradual manner until $I_h$ reaches zero, and it thereafter also reduces $V_m$ until $I_m$ reaches zero at a point in time near the end of the timing burst. From then on, a charge pulse or discharge pulse causes only 80 μA to be driven into or drawn from junction 62 and thus to flow through the filter capacitor C1. Between the beginning of the acquisition phase and the time at which the current-level change ends, therefore, the gain through the integration part of the loop has been reduced by a factor of 100. Since, as was explained above, the gain in the proportional part of the loop should change only as the square root of the integration-path gain if the damping factor is to remain constant, the current drawn and driven by charge pump 74, 76 should track the change in the other charge-pump current on a square-root basis so as to change only by a factor of 10. This is in fact what happens, as can be appreciated by referring to FIG. 3B, which depicts the charge pump 74, 76 whose current level determines the gain with which the proportional component of the VCO control voltage is generated.

Figure 3B:
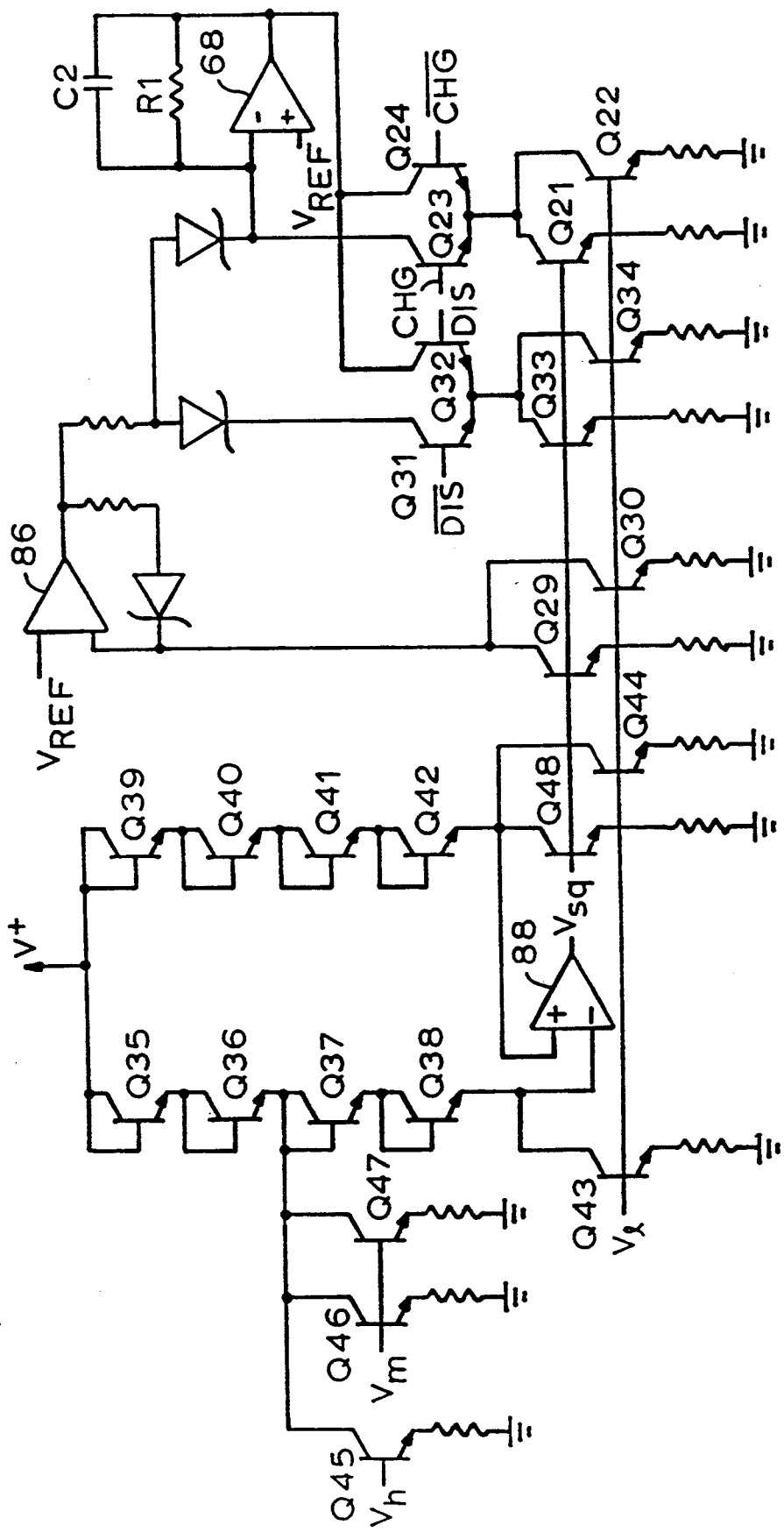

Like the charge pump 58, 60 of FIG. 3A, the charge pump 74, 76 of FIG. 3B comprises switched current sources, each of which supplies the sum of two currents whose values are controlled by different respective control voltages. However, each of the current sources 74 and 76 of FIG. 3B comprises only a single such switched source. Specifically, the charging current source 74 of FIG. 3B comprises transistors Q21, Q22, Q23, and Q24, which operate similarly to transistors Q1, Q2, Q3, and Q4, respectively. Also, differential amplifier 86 and transistors Q29, Q30, Q31, Q32, Q33, and Q34 make up the discharge current source 76 of FIG. 3B and operate similarly to amplifier 80 and transistors Q9, Q10, Q11, Q12, Q13, and Q14 of discharge source 60.

Like transistors Q2, Q10, and Q14 in the integrator-path charge pump 58, 60, corresponding transistors Q22, Q30, and Q34 in the proportional-path charge pump 74, 76 are controlled by control voltage $V_l$ and draw currents that have the constant value $I_l$. On the other hand, proportional-path current-source transistors Q21, Q29, and Q33, which otherwise perform in the same manner as integrator-path current-source transistors Q1, Q9, and Q13, are not controlled directly by $V_m$. Instead, they are controlled by a control voltage $V_{sq}$, which is so generated as to cause the proportional path charge-pump current to be proportional to the square root of the integral-path charge-pump current. That is, $$I_{sq} + I_l = K_p(I_h + 2I_m + I_l)^{\frac{1}{2}}, \quad (11)$$

where $K_p$ is a proportionality constant. The proportionality constant in the illustrated embodiment is $(I_l)^{\frac{1}{2}}$, so the two charge-pump currents are equal in the tracking mode, when the integrator-path charge pump draws only $I_l$.

The voltage $V_{sq}$ is generated by a circuit that includes two chains of four diode-connected transistors each, one chain comprising transistors Q35 through Q38 and the other comprising transistors Q39 through Q42. Two current-source transistors Q43 and Q44, whose emitter-circuit resistances equal those of transistors Q22, Q30, and Q34 and are similarly controlled by control voltage $V_l$, draw currents of magnitude $I_l$ from respective ones of the transistor chains. Additionally, further transistors Q45, Q46, and Q47 are controlled by control voltages Vh and Vm so as to draw through transistors Q35 and Q36 an additional $I_l + 2I_m$.

Now, the current in a diode is given by the following equation:

$$I = I_s[\exp(qV/kT) - 1], \quad (12)$$

where $I_s$ is a current magnitude dependent on the particular diode, q is the elementary charge, V is the diode voltage, k is Boltzmann's constant, and T is the diode temperature. The transistors and the low current $I_l$ are so chosen that the value of the exponential in equation (12) greatly exceeds unity, so the following is a valid approximation to the voltage across each diode-connected transistor:

$$V = (kT/q)\log(I/I_s) \quad (13)$$

If we assume that all of the transistors in both chains are matched and that their temperatures are equal, the resultant voltage across the left chain is given by the following expression:

$$V_c = (2kT/q)\{\log[(I_l + 2I_m + I_h)/I_s] + \log(I_l/I_s)\} \quad (14)$$

A differential amplifier 88 receives this voltage at its inverting input terminal, receives the corresponding voltage from the bottom of the right-hand chain at its non-inverting input terminal, and applies the resultant voltage to the base of a transistor Q48 whose collector is connected to the bottom of the right-hand transistor chain. Because of the feedback provided to amplifier 88, transistor Q48 causes the voltage at the bottom of the chain on the right to equal the voltage at the bottom of the chain on the left. Therefore, this common chain voltage can also be given by the following expression:

$$V_c = (4kT/q)\log[(I_l + I_{sq})/I_s]. \quad (15)$$

where $I_{sq}$ is the collector current of Q48. Equating the right sides of equations (14) and (15) yields the following result:

$$(I_{sq} + I_l)/I_l = [(I_h + 2I_m + I_l)/I_l]^{\frac{1}{2}}. \quad (16)$$

which is the same as equation (11) with $K_P = (I_l)^{\frac{1}{2}}$.

Since Q44 draws $I_1$, the current $I_{sq}$ flows in emitter-follower transistor Q48, whose emitter-circuit resistance equals that of transistors Q21, Q29, and Q33. Since amplifier 88 applies to the bases of those transistors the same voltage that it applies to the base of transistor Q48 to cause it to draw $I_{sq}$, those transistors draw that current, too, and the desired square-root relationship between the two charge pumps results.

FIG. 3B shows a small ripple-filter capacitor C2 wired in parallel with the resistor R1 across which the proportional component of the VCO control voltage appears. FIG. 2 omits that capacitor because it is small enough not to have a significant effect at the frequencies for which the loop analysis is valid. But circuit elements that do have a significant effect can be employed without departing from the teachings of the present invention. Suppose, for example, that a resistor is placed in series with capacitor C1 or that a capacitor is placed in series with resistor R1. The "proportional" path would then gain an integral component or the "integral" path would gain a proportional component, and one or the other (or both) charge pumps would then have some effect on the effective gains for both components. So long as the ratios of resistance to capacitance in the two paths are different, however, the proportional- and integral-component gains would still be separately adjustable in the sense that it would still be possible to vary the effective loop gain for the proportional component through a dynamic range different from that through which the effective loop gain for the integral component varies.

Furthermore, although we believe that it is advantageous to vary the loop gain by varying charge-pump currents, it is clear that the broader principles of the present invention can be employed in phase-locked loops that employ other means of gain variation. For example, the input to amplifier 78 of FIG. 2 could instead be the voltage on the arm of a potentiometer (or, more typically, its electronic equivalent) to whose ends are applied the outputs of proportional and integral paths fed by a common charge pump. The different dynamic ranges in such an arrangement could be achieved by varying the charge-pump current and potentiometer setting simultaneously.

Also, although the circuitry in the illustrated embodiment is arranged to provide a square-root relationship between the charge-pump current ranges because such a relationship tends to minimize damping-factor variation, the damping factor still does not remain completely constant; the frequency with which charge and discharge pulses are applied to the charge pumps in the track mode will typically be lower on the average than that at which they are applied during the acquisition mode, so the variation in effective loop gain in the illustrated embodiment is actually greater than the variation in charge-pump current. But the damping-factor variation is still smaller than it would be with only a single gain control. This illustrates that the benefits of the invention do not require the square-root relationship.

Indeed, there may be situations in which it would be desirable to use the different-gain concept of the present invention to increase, not decrease, the damping-factor variation over what it would be with a single gain control, at least in one part of the operating regime. For example, the illustrated embodiment could be so modified that the overall ranges of the two charge pumps are the same but that only the gain of the proportional component is reduced at the beginning of the acquisition mode; i.e., the dynamic range of the proportional-component variation initially exceeds the (zero) dynamic range of the integral-component variation. Then, when the proportional-component gain reaches the value that it initially assumes in the illustrated embodiment, the square-root-relationship variation described above begins. The impulse response at the beginning of the acquisition mode for such a system would typically include a slowly decaying exponential that in the limit represents a static error, but it would also include a exponential that decays very rapidly. The initial part of the acquisition mode would thus be used to close in very quickly on the (presumably small) "static" error, which would then be eliminated in the manner described above in connection with the illustrated embodiment.

In short, the principles of the present invention can be employed in a wide range of embodiments. The invention thus constitutes a significant advance in the art.

We claim:

1. A phase-locked loop comprising:
   A) a variable-frequency oscillator, adapted for application thereto of a frequency-control signal, for generating an oscillator output whose frequency is determined by the value of the frequency-control signal;
   B) a phase detector adapted for application thereto of a input signal and responsive to the oscillator output to generate a phase-detector output indicative of the phase relationship between the input signal and the oscillator output; and
   C) a proportional-plus-integral feed-forward network responsive to the phase-detector output to generate a frequency-control signal and apply it to the oscillator, the feed-forward network comprising:
      i) a proportional-plus-integral path for generating in the frequency-control signal proportional and integral components that are proportional, in accordance with separately adjustable proportional-component and integral-component gains, respectively, to the phase-detector output and the integral thereof; and
      ii) gain-adjustment circuitry for making different variations in the integral-component and proportional-component gains.

2. A phase-locked loop as defined in claim 1 wherein the gain-adjustment circuitry varies the proportional-component gain with the integral-component gain but through a dynamic range less than that through which it varies the integral-component gain.

3. A phase-locked loop as defined in claim 2 wherein:
   A) the proportional-plus-integral path includes:
      i) two separate charge pumps controlled by the phase-detector output;
      ii) a separate parallel signal path associated with each charge pump and driven by its associated charge pump to generate a parallel-path output; and iii) a summing circuit that adds the parallel-path outputs to generate the proportional and integral components of the frequency-control signal; and B) the gain-adjustment circuitry varies the gain by varying the charge-pump currents.

4. A phase-locked as defined in claim 3 wherein one of the parallel signal paths is a substantially proportional path and the other is a substantially integral path.

5. A phase-locked as defined in claim 3 wherein the gain-adjustment circuitry varies the proportional-component gain in proportion to the square root of the integral-component gain.

6. A phase-locked loop as defined in claim 2 wherein the gain-adjustment circuitry varies the proportional-component gain in proportion to the square root of the integral-component gain.

7. A phase-locked loop as defined in claim 1 wherein:
A) the proportional-plus-integral path includes:
    i) two separate charge pumps controlled by the phase-detector output;
    ii) a separate parallel signal path associated with each charge pump and driven by its associated charge pump to generate a parallel-path output; and
    iii) a summing circuit that adds the parallel-path outputs to generate the proportional and integral components of the frequency-control signal; and
B) the gain-adjustment circuitry varies the gain by varying the charge-pump currents.

8. A phase-locked loop as defined in claim 7 wherein one of the parallel signal paths is a substantially proportional path and the other is a substantially integral path.

9. A phase-locked loop as defined in claim 1 wherein:
A) the proportional-plus-integral path includes:
    i) separate parallel signal paths responsive to the phase-detector output to generate respective parallel-path outputs; and
    ii) a summing circuit that adds the parallel-path outputs to generate the proportional and integral components of the frequency-control signal; and
B) the gain-adjustment circuitry separately varies the gains that characterize the parts of the response of the frequency-control signal to the phase-detector output that result from the different parallel signal paths.

10. A phase-locked loop as defined in claim 9 wherein one of the parallel signal paths is a substantially proportional path and the other is a substantially integral path.

11. A phase-locked loop comprising:
A) a variable-frequency oscillator, adapted for application thereto of a frequency-control signal, for generating an oscillator output whose frequency is determined by the value of the frequency-control signal;
B) a phase detector adapted for application thereto of an input signal and responsive to the oscillator output to generate a phase-detector output indicative of the phase relationship between the input signal and the oscillator output; and
c) a proportional-plus-integral feed-forward network responsive to the phase-detector output to generate a frequency-control signal and apply it to the oscillator, the feed-forward network comprising:
    i) a proportional-plus-integral path for generating in the frequency-control signal proportional and integral components that are proportional, in accordance with separately adjustable proportional-component and integral-component gains, respectively, to the phase-detector output and the integral thereof, the proportional-plus-integral path including:
        a) two separate charge pumps controlled by the phase-detector output,
        b) a separate parallel signal path associated with each charge pump and driven by its associated charge pump to generate a parallel-path output, one of the parallel signal paths being a substantially proportional path and the other being a substantially integral path; and
        c) a summing circuit that adds the parallel-path outputs to generate the proportional and integral components of the frequency-control signal; and
    ii) gain-adjustment circuitry for so varying the charge-pump currents as to vary the proportional-component gain in proportion to the square root of the integral-component gain.

12. A disk drive comprising:
A) a head-reading mechanism for reading a magnetic disk and generating in response thereto a read signal comprising pulses that represent timing and data information contained on the disk;
B) a phase-locked loop comprising:
    i) a variable-frequency oscillator, adapted for application thereto of a frequency-control signal, for generating an oscillator output whose frequency is determined by the value of the frequency-control signal;
    ii) a phase detector responsive to the read signal and the oscillator output to generate a phase-detector output indicative of the phase relationship between the read signal and the oscillator output; and
    iii) a proportional-plus-integral feed-forward network responsive to the phase-detector output to generate a frequency-control signal and apply it to the oscillator, the feed-forward network comprising:
        a) a proportional-plus-integral path for generating in the frequency-control signal proportional and integral components that are proportional, in accordance with separately adjustable proportional-component and integral-component gains, respectively, to the phase-detector output and the integral thereof; and
        b) a gain-adjustment circuitry for making different variations in the integral-component and proportional-component gains; and
C) a data-extraction circuit responsive to the read signal and the oscillator output for extracting the data information from the read signal in accordance with timing established by the oscillator output.

13. A disk drive as defined in claim 12 wherein the gain-adjustment circuitry varies the proportional-component gain with the integral-component gain but through a dynamic range less than that through which it varies the integral-component gain.

14. A disk drive as defined in claim 13 wherein:
A) the proportional-plus-integral path includes:
    i) two separate charge pumps controlled by the phase-detector output;
    ii) a separate parallel signal path associated with each charge pump and driven by its associated charge pump to generate a parallel-path output; and iii) a summing circuit that adds the parallel-path outputs to generate the proportional and integral components of the frequency-control signal; and B) the gain-adjustment circuitry varies the gain by varying the charge-pump currents.

15. A disk drive as defined in claim 14 wherein one of the parallel signal paths is a substantially proportional path and the other is a substantially integral path.

16. A disk drive as defined in claim 14 wherein the gain-adjustment circuitry varies the proportional-component gain in proportion to the square root of the integral-component gain.

17. A disk drive as defined in claim 13 wherein the gain-adjustment circuitry varies the proportional-component gain in proportion to the square root of the integral-component gain.

18. A disk drive as defined in claim 12 wherein:
A) the proportional-plus-integral path includes:
  i) two separate charge pumps controlled by the phase-detector output;
  ii) a separate parallel signal path associated with each charge pump and driven by its associated charge pump to generate a parallel-path output; and
  iii) a summing circuit that adds the parallel-path outputs to generate the proportional and integral components of the frequency-control signal; and
B) the gain-adjustment circuitry varies the gain by varying the charge-pump currents.

19. A disk drive as defined in claim 18 wherein one of the parallel signal paths is a substantially proportional path and the other is a substantially integral path.

20. A disk drive as defined in claim 12 wherein:
A) the proportional-plus-integral path includes:
  i) separate parallel signal paths responsive to the phase-detector output to generate respective parallel-path outputs; and
  ii) a summing circuit that adds the parallel-path outputs to generate the proportional and integral components of the frequency-control signal; and
B) the gain-adjustment circuitry separately varies the gains that characterize the parts of the response of the frequency-control signal to the phase-detector output that result from the different parallel signal paths.

21. A disk drive as defined in claim 20 wherein one of the parallel signal paths is a substantially proportional path and the other is a substantially integral path.

22. A disk drive comprising:

A) a head-reading mechanism for reading a magnetic disk and generating in response thereto a read signal comprising pulses that represent timing and data information contained on the disk;

B) a phase-locked loop comprising:
  i) a variable-frequency oscillator; adapted for application thereto of a frequency-control signal, for generating an oscillator output whose frequency is determined by the value of the frequency-control signal;
  ii) a phase detector responsive to the read signal and the oscillator output to generate a phase-detector output indicative of the phase relationship between the read signal and the oscillator output; and
  iii) a proportional-plus-integral feed-forward network responsive to the phase-detector output to generate a frequency-control signal and apply it to the oscillator, the feed-forward network comprising:
    a) a proportional-plus-integral path for generating in the frequency-control signal proportional and integral components that are proportional, in accordance with separately adjustable proportional-component and integral-component gains, respectively, to the phase-detector output and the integral thereof, the proportional-plus-integral path including:
      1) two separate charge pumps controlled by the phase-detector output.
      2) a separate parallel signal path associated with each charge pump and driven by its associated charge pump to generate a parallel-path output, one of the parallel signal paths being a substantially proportional path and the other being a substantially integral path; and
      3) a summing circuit that adds the parallel-path outputs to generate the proportional and integral components of the frequency-control signal; and
    b) gain-adjustment circuitry for so varying the charge-pump currents as to vary the proportional-component gain in proportion to the square root of the integral-component gain; and C) a data-extraction circuit responsive to the read signal and the oscillator output for extracting the data information from the read signal in accordance with timing established by the oscillator output.

* * * * *